(12) United States Patent
Cheng et al.

(10) Patent No.: US 7,641,295 B2
(45) Date of Patent: Jan. 5, 2010

(54) FOLDABLE HOST UNIT CASE FOR A COMPUTER WITH JOINT MECHANISMS

(75) Inventors: Sheng-Hsiung Cheng, Taipei Hsien (TW); Te-An Lin, Taipei Hsien (TW); Wu-Nan Wang, Taipei Hsien (TW); Chia-Chia Huang, Taipei Hsien (TW)

(73) Assignee: Aopen Inc., Taipei Hsien (TW)

( * ) Notice: Subject to any disclaimer, the term of this patent is extended or adjusted under 35 U.S.C. 154(b) by 335 days.

(21) Appl. No.: 11/730,031

(22) Filed: Mar. 29, 2007

(65) Prior Publication Data

US 2007/0253156 A1 Nov. 1, 2007

(30) Foreign Application Priority Data

Apr. 26, 2006 (TW) .............................. 95114988 A

(51) Int. Cl.
*A47B 43/00* (2006.01)
(52) U.S. Cl. .................................... 312/223.2; 312/258
(58) Field of Classification Search ............. 312/223.2, 312/265.5, 265.6, 258, 262; 361/679.02, 361/679.31, 679.6, 679.33; 220/6, 7, 666, 220/668
See application file for complete search history.

(56) References Cited

U.S. PATENT DOCUMENTS

| | | | | |
|---|---|---|---|---|
| 1,481,560 A | * | 1/1924 | Ringer | 312/258 |
| 3,525,451 A | * | 8/1970 | Asser | 220/6 |
| 3,527,339 A | * | 9/1970 | Cipolla | 206/290 |
| 3,527,340 A | * | 9/1970 | Cipolla | 206/278 |
| 5,560,502 A | * | 10/1996 | Hsiung | 211/195 |
| 5,593,046 A | * | 1/1997 | Katsuura et al. | 211/41.15 |
| 6,166,910 A | * | 12/2000 | Ronberg et al. | 361/724 |
| 6,168,249 B1 | * | 1/2001 | Chien | 312/265.4 |
| 6,535,382 B2 | * | 3/2003 | Bishop et al. | 361/690 |
| 2005/0122675 A1 | * | 6/2005 | Cheng | 361/685 |
| 2007/0241647 A1 | * | 10/2007 | Cheng et al. | 312/223.2 |
| 2007/0253155 A1 | * | 11/2007 | Cheng et al. | 361/683 |
| 2007/0262681 A1 | * | 11/2007 | Cheng et al. | 312/223.2 |

FOREIGN PATENT DOCUMENTS

| | | | |
|---|---|---|---|
| EP | 1855513 | * | 11/2007 |
| JP | 2005045056 | * | 2/2005 |

* cited by examiner

*Primary Examiner*—Janet M Wilkens

(57) ABSTRACT

A foldable host unit case for a computer with joint mechanisms includes four holding posts and the upper ends of the holding posts connect with a neighboring holding post with first foldable connecting rods and second foldable connecting rods respectively. The lower ends of the holding posts are joined to four ends of a cross connecting rod set such that the holding posts are capable of being extended to constitute a firm structure. Hence, the host unit case is capable of being extended conveniently and quickly and being folded conveniently to reduce the volume thereof during being packaged.

6 Claims, 5 Drawing Sheets

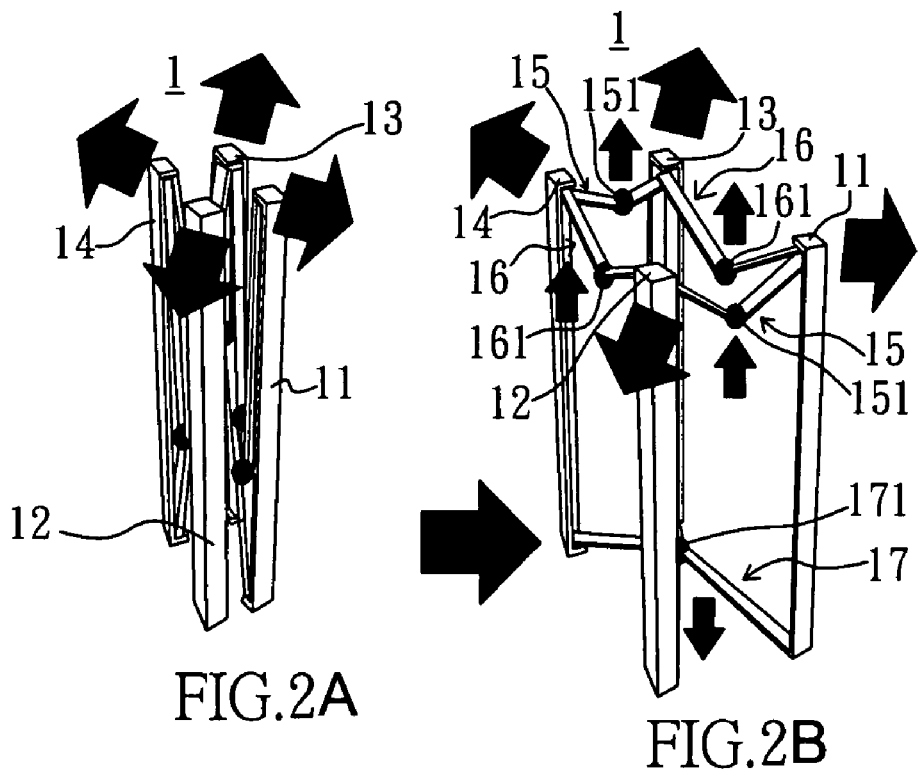
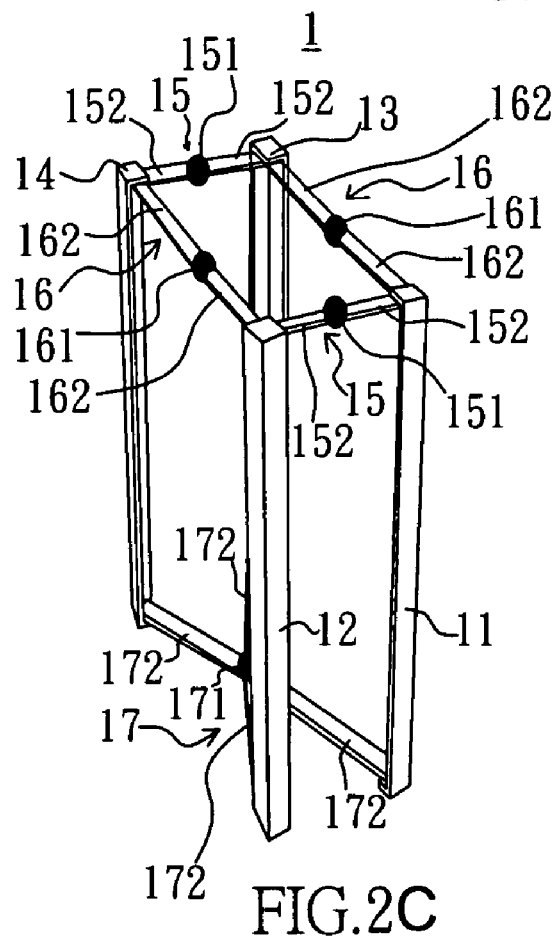

FOLDABLE HOST UNIT CASE FOR A COMPUTER WITH JOINT MECHANISMS

BACKGROUND OF THE INVENTION

1. Field of the Invention

The present invention is related to a host unit case of a personal computer and particularly to a built-up type host unit case of a computer.

2. Brief Description of Related Art

The host unit case is employed to receive electronic devices such as a main board, hard disks, optical disk drives, floppy disk drives and power supply device. Usually, the host unit case is set up with an unchangeable structure. The composite type host unit case has such as U.S. Pat. No. 6,961,236, which discloses a computer chassis, and Taiwan patent publication No. M258544, which discloses a host unit case accommodating ATX and BTX specifications.

Following prior art is belonged to a further type for the host unit case is made available for being disassembled into several parts before being set up as the host unit case. Taiwan Patent Publication Nos. 468811 discloses a host unit case for an industrial computer. Taiwan Patent Publication No. 490120 discloses a composite computer chassis. Taiwan Patent Publication No. 474423 discloses a computer chassis free from aid of hand tools. Taiwan Patent Publication No. 490120 discloses a composite type computer chassis. Taiwan Patent Publication No. 531142 discloses a composite type computer chassis assembly.

Further, the computer chassis free from aid of hand tools disclosed in Taiwan Patent Publication No. 474423 provides the front and rear cover plates, which are pivotally joined to a bottom plate with head pins, two frame plates for a big floppy disk drive, which are pivotally joined to the front and rear cover plates, and a cover plate for a small floppy disk drive is assembled to a frame plate and is fixedly hung to the bottom of frame plate for the big floppy disk drive. Further, four L shaped plates are fixed at four corners of the bottom plate to be joined to the two cover plates firmly. Finally, two lateral cover plates are hooked to the lateral sides of the preceding structure and fastened with set screws after the main board and the power supply frame being mounted to the preceding structure to complete the whole assembly of the computer chassis. The parts of the computer chassis are packaged separately such that less space is required for storage.

However, parts of the preceding prior art are so many and divided into several part groups and it is inconvenient to pick right parts during setting up the computer chassis such that it is hard to gather the parts before assembling and it takes a lot of time to set up the computer chassis.

SUMMARY OF THE INVENTION

The crux of the present invention is to develop a host unit case, which is capable of being folded and set up more conveniently for being favorable for reduction of delivery cost and economy of storage space.

The primary object of the present invention is to provide a foldable host unit case for a computer with joint mechanisms with which the host unit case can be set up completely, easily and quickly to enhance fun while the host unit case being set up by the user.

Another object of the present invention is to provide a foldable host unit case for a computer with joint mechanisms with which the parts can be gathered together and reduced to a small volume while being packaged such that it is capable of lowering delivery cost and saving storage space.

Accordingly, A foldable host unit case for a computer with joint mechanisms with which a reduced volume of the host unit case is obtained while being folded packaged and convenience and quickness are reached while being set up as a firm structure, comprising:

a main structure, which further comprises:

a first holding post with a first upper end and a first lower end;

a second holding post with a second upper end and a second lower end;

a third holding post with a third upper end and a third lower end;

a fourth holding post with a fourth upper end and a fourth lower end;

two first foldable connecting rods, one of the first foldable connecting rods having two ends thereof being joined to the first upper end and the second upper end respectively and another one of the first foldable connecting rods having two ends thereof being joined to the third upper end and the fourth upper end respectively;

two second foldable connecting rods, one of the second foldable connecting rods having two ends thereof being joined to the first upper end and the third upper end respectively and another one of the second foldable connecting rods having two ends thereof being joined to the second upper end and the fourth end respectively; and a cross connecting rod set with four ends, being joined to the first lower end, the second lower end, the third lower end and the fourth lower end with the four ends respectively;

wherein, the respective first foldable connecting rod provides a first joint with a first rod section extending from two ends of the first joint respectively; the respective second foldable connecting rod provides a second joint with a second rod section extending from two ends of the second joint; and the cross connecting rod set provides a third joint with four third rod section extending from the third joint respectively;

whereby, the first, second, third and fourth holding posts are capable of being extended to constitute a firm structure such that the host unit case is capable of being set up conveniently and quickly and being folded conveniently for reducing the volume of the host unit case during being packaged.

BRIEF DESCRIPTION OF THE DRAWINGS

The present invention can be more fully understood by reference to the following description and accompanying drawings, in which:

FIGS. 2A to 2C are perspective views illustrating steps for extending main structure of the first embodiment of the present invention;

DETAILED DESCRIPTION OF THE INVENTION

Figure 1:
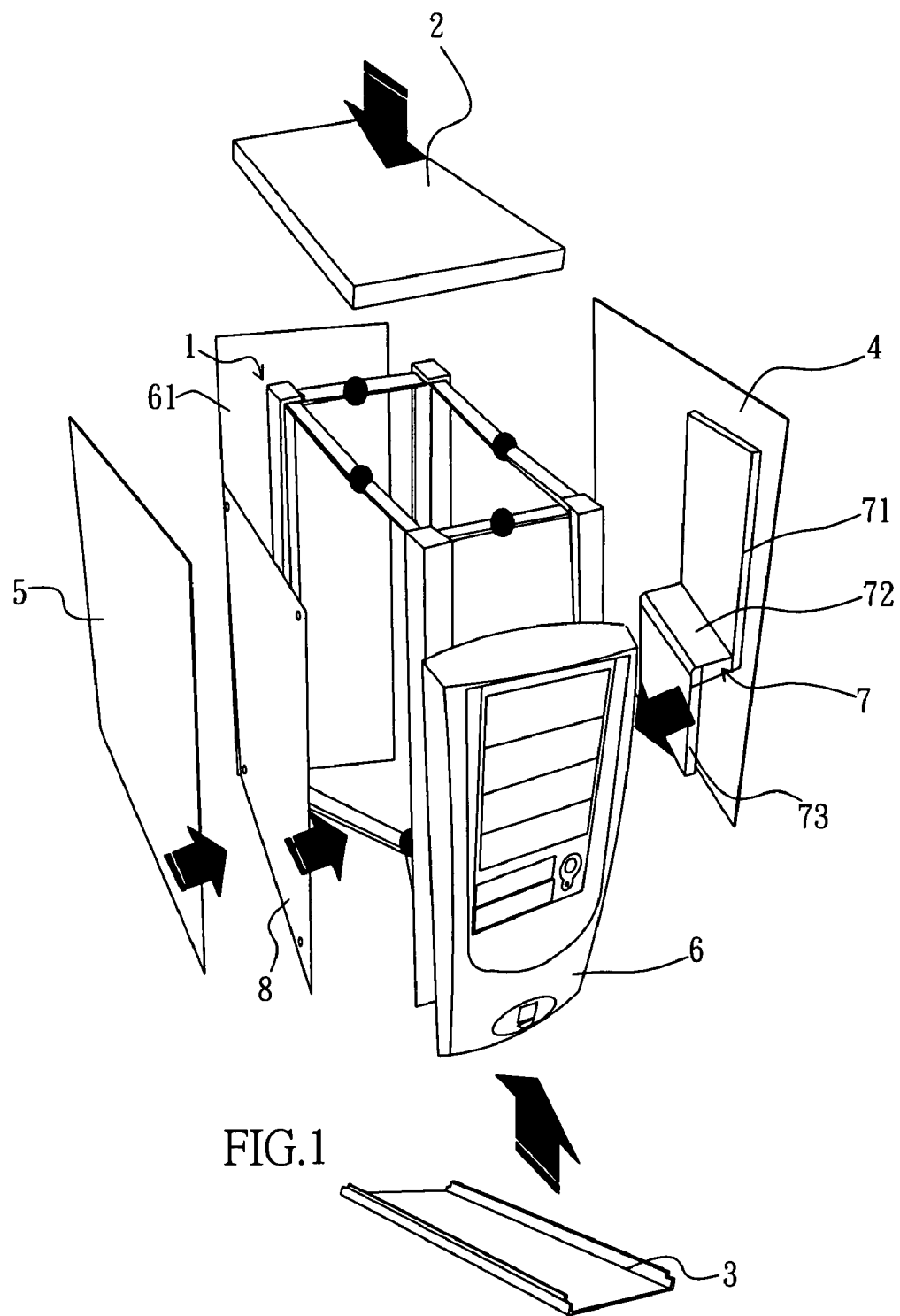
FIG. 1 is an exploded perspective view of an embodiment of a foldable host unit case for a computer with joint mechanisms according to the present invention.
Figure 3:
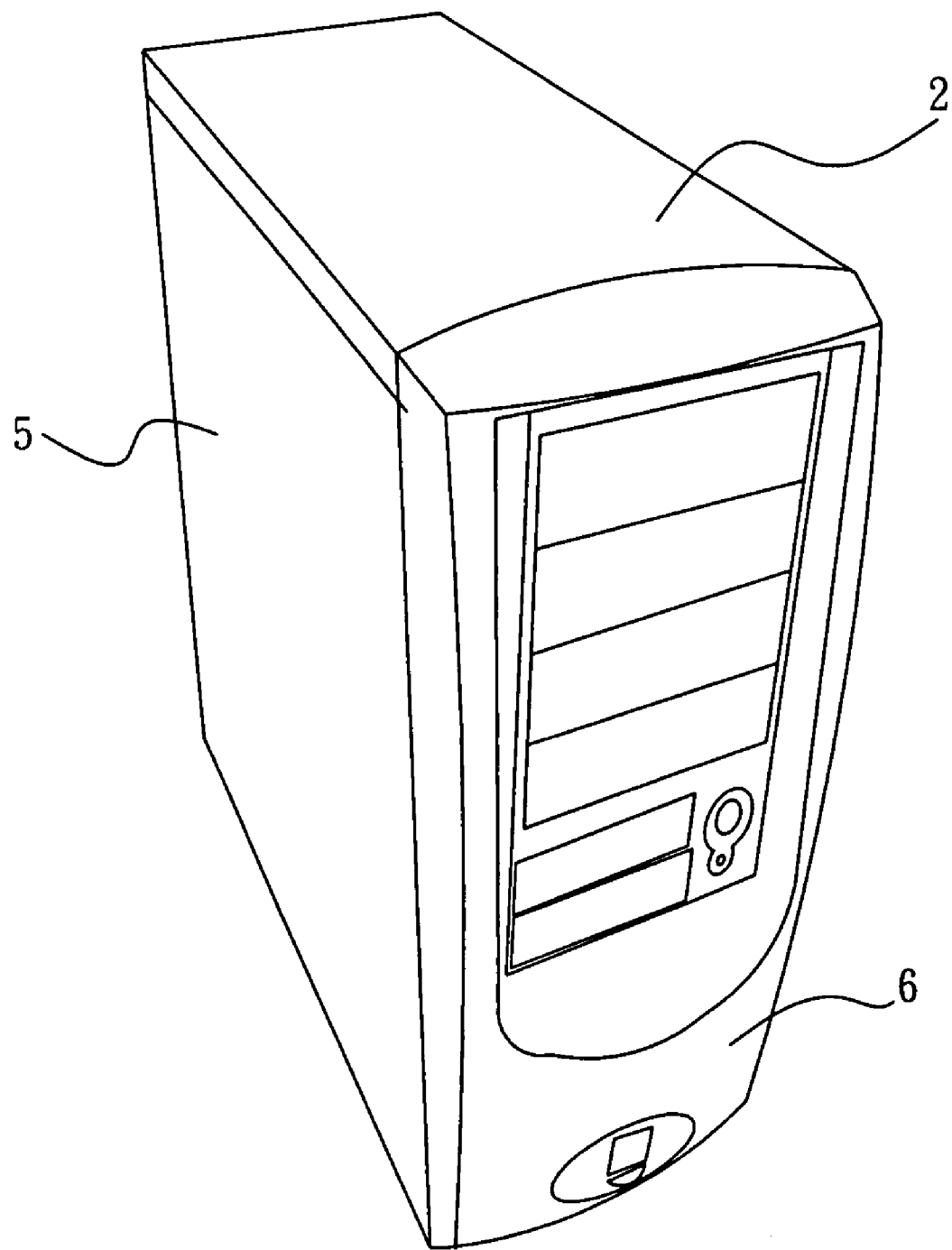
FIG. 3 is a perspective view of the first embodiment of the present invention.

Referring to FIGS. 1 and 3, the first embodiment of a foldable host unit case for a computer with joint mechanisms according to the present invention is capable of being reduced volume thereof for packaging and being completely set up conveniently and quickly. The host unit case includes a main structure 1, which is attached to an upper cover 2 and a lower cover 3 at the top and the bottom thereof respectively, attached to a first lateral plate 4 and a second lateral plate 5 at the left side and the right side thereof respectively, and attached to a front panel 6 and a rear wall 61 at the front side and the rear side thereof respectively to form a firm structure as shown in FIG. 3. The first lateral plate 4 is joined to a foldable first support frame 7 at the inner side thereof. The second lateral plate 5 is joined to a second support frame 8 at the inner side thereof. The preceding parts are attached to each other by means of conventional ways such as corresponding holes provided at the preceding parts and screws passing through the holes or holes corresponding to projections provided at the preceding parts and the projections engaging with the holes.

Referring to FIG. 2C, the main structure 1 of the first embodiment further includes two first foldable connecting rods 15 and two second foldable connecting rods 16. One of the first foldable connecting rods 15 has two ends thereof attached to the upper end of a first holding post 11 and the upper end of a second holding post 12 respectively and another one of the first foldable connecting rods 15 has two ends thereof attached to the upper end of a third holding post 13 and the upper end of a fourth holding post 14. One of the second foldable connecting rods 16 has both ends thereof attached to the upper end of the first holding post 11 and the upper end of the third holding post 13 respectively and another one of the second foldable connecting rods 16 has both ends thereof attached to the upper end of the second holding post 12 and the upper end of the fourth holding post 14 respectively. A cross connecting rod set 17 has the four ends thereof attached to the lower ends of the four holding posts 11, 12, 13 and 14 respectively. The respective first connecting rod 15 has two first rod sections 152 being attached to two ends of a first joint 151. The respective second connecting rod 16 has two second rod sections 162 attached to two ends of a second joint 161. The cross connecting rod set 17 has a third joint 171 attached with an end of four third rod sections 172 respectively. The respective first connecting rod 15 is shorter than the respective second connecting rod 16 and the holding posts are joined to an end of the cross connecting rod set 17 respectively so as to constitute a part to be attached to the upper or lower covers respectively. The holding posts attached to an end of the cross connecting rod set 17 respectively constitute a part to join the front panel or the rear wall respectively.

Figure 4A:
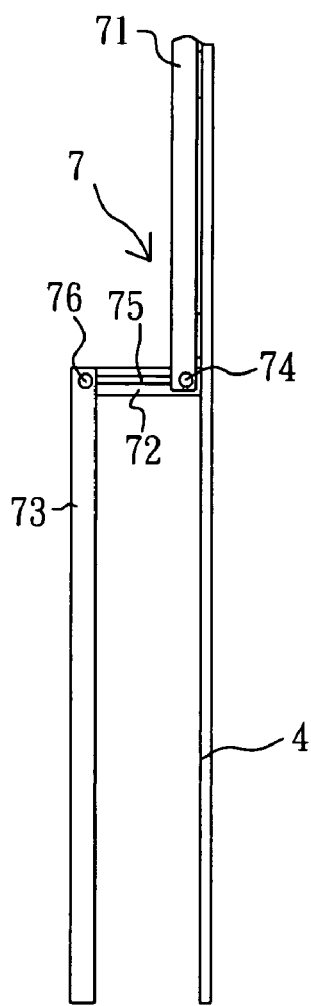
FIGS. 4A to 4C are side elevational views illustrating steps for folding the first support frame in the embodiment of the present invention.
Figure 4B:
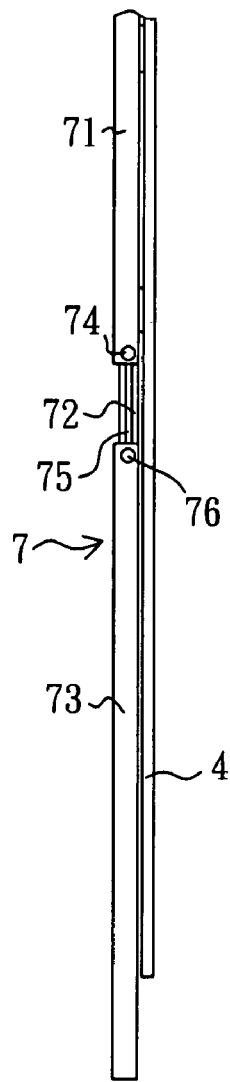
Figure 4C:
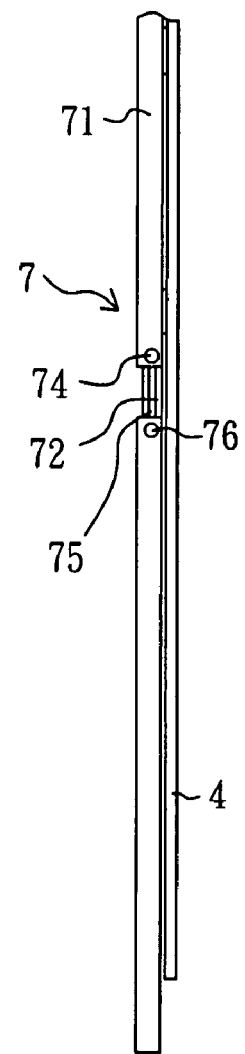

Referring to FIGS. 1 and 4A to 4C, the first support frame 7 which is composed of a first plate 71, a second plate 72 and a third plate 73 pivotally connecting with each other sequentially. The first plate 71 is attached to the inner side of a first lateral plate 4 and the lower end of the first plate 71 pivotally connects with the second plate 72 with a first pivotal shaft 74. The upper end of the third plate 73 pivotally connects with an elongated groove 75 of the second plate 72 with a second pivotal shaft 76. In this way, the third plate 73 is capable of extending toward the second support frame 8 or folding toward the first lateral plate 4 such that the second plate 72 and the third plate 73 can move to lean against the first lateral plate 4. The third plate 73 is capable of moving closer to the first plate 71 due to the second pivotal shaft 76 moving in the elongated groove 75 as shown in FIGS. 4B and 4C. The lower end of the third plate 73 is fixedly joined to the lower cover 3. A space between the second support frame 8 and the first plate 71 is longer and sufficient for being attached with a first electronic device such as 5.25" disk drive and a space between the second support frame 8 and the third plate 73 is shorter and suitable for being attached with a second electronic device such as 3.25" disk drive.

Referring to FIGS. 1 and 2A, when the host unit case of the first embodiment is packaged, the upper cover 2, the lower cover 3, the first lateral plate 4, the second lateral plate 5, the front panel 6 and the rear wall 61 are separated from the main structure 1 and the main structure 1 is folded in a state as shown in FIG. 2A to reduce the volume thereof greatly. When the folded host unit case 1 is extended, the first holding post 11, the second holding post 12, the third holding post 13 and the fourth holding post 14 are extend in company with the first connecting rods 15, the second connecting rods 16 and the cross connecting rod set 17. Meanwhile, the first joints 151 and the second joints 161 move upward gradually and the third joint 171 moves downward gradually as shown in FIGS. 2A and 2B. FIG. 2C shows the host unit case 1 in a state of being fully extended. Finally, other parts are attached to the fully extended main structure to form a firm host unit case as shown in FIG. 3.

Figure 5A:
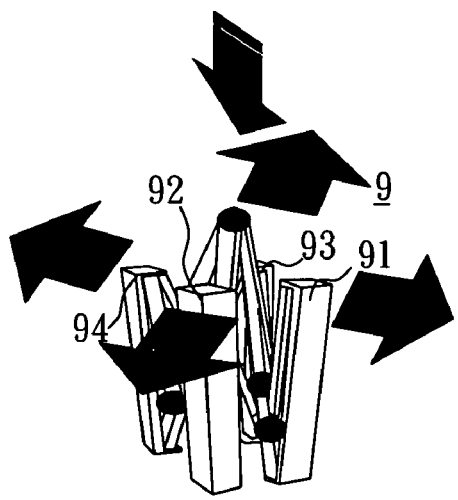
FIGS. 5A to 5C are perspective views illustrating steps for extending main structure of the second embodiment of the present invention.
Figure 5B:
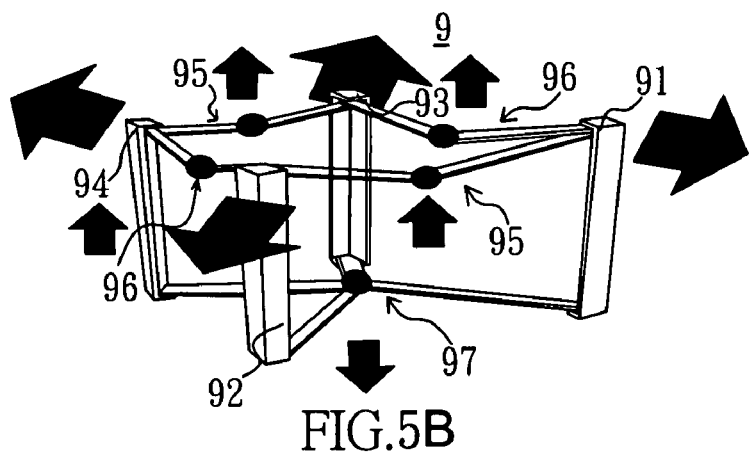
Figure 5C:
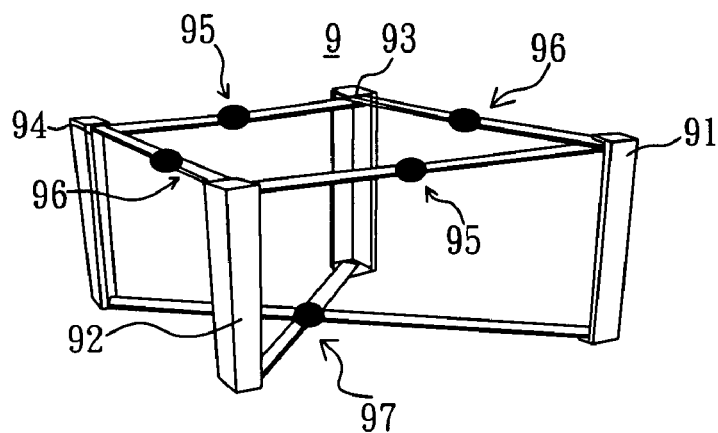

Referring to FIG. 5C, the second embodiment of the present invention provides a main structure 9 almost the same as the main structure 1 and includes a fifth holding post 91, a sixth holding post 92, a seventh holding post 93 and an eighth holding post 94. The upper ends of the four holding posts are attached to third connecting rods 95 and fourth connecting rods 96 and the lower ends of the four holding posts are attached to an end of another cross connecting rod set 97. The holding posts provided in the second embodiment are shorter than those provided in the first embodiment. The holding posts of the present embodiment are joined to ends of the cross connecting rods 97 for being attached to the first lateral plate or the second lateral plate. The steps for extending the main structure 9 illustrated in FIGS. 5A to 5C are almost the same as those for extending the main structure 1 illustrated in FIGS. 2A to 2C.

It is appreciated that the foldable host unit case for a computer with joint mechanisms according to the present invention is capable of being set up a complete host unit case easily and quickly to enhance fun with self setting up the host unit case and be favorable for decreasing delivery cost and saving available storage space.

While the invention has been described with referencing to preferred embodiments thereof, it is to be understood that modifications or variations may be easily made without departing from the spirit of this invention, which is defined by the appended claims.

What is claimed is:

1. A foldable host unit case with joint mechanisms for a computer comprising:

a main structure with a front side, a rear side, a first lateral side, a second lateral side, an upper side and a bottom side;

a first lateral plate being detachably attached to the first lateral side of the main structure; and a second lateral plate being detachably attached to the second lateral side of the main structure to be opposite to said first lateral plate;

wherein, said main structure further comprises:

a first holding post with a first upper end and a first lower end;

a second holding post with a second upper end and a second lower end;

a third holding post with a third upper end and a third lower end;

a fourth holding post with a fourth upper end and a fourth lower end;

two first foldable connecting rods with one of the first foldable connecting rods having two ends thereof being joined to the first upper end and the second upper end respectively and another one of the first foldable connecting rods having two ends thereof being joined to the third upper end and the fourth upper end respectively;

two second foldable connecting rods with one of the second foldable connecting rods having two ends thereof being joined to the first upper end and the third upper end respectively and another one of the second foldable connecting rods having two ends thereof being joined to the second upper end and the fourth end respectively; and a cross connecting rod set with four ends being joined to the first lower end, the second lower end, the third lower end and the fourth lower end respectively; wherein, the respective first foldable connecting rod provides a first joint with a first rod section extending from two ends of the first joint respectively; the respective second foldable connecting rod provides a second joint with a second rod section extending from two ends of the second joint; and the cross connecting rod set provides a third joint with four third rod section extending from the third joint respectively such that the first, second, third and fourth holding posts are capable of being extended to constitute a firm structure; and said first lateral plate further comprises a first support frame and said second lateral plate comprises a second support frame; wherein said first support frame provides a first plate, a second plate and a third plate, which pivotally connect with each other sequentially in such a way of the first plate being joined to the inner side of the first lateral plate, a lower end of the first plate being joined an end of the second plate, an upper end of the third plate being joined to another end of the second plate, and the third plate is closer to the second support frame than the first plate for a space between the second support frame and the first plate being capable of accommodating an electronic device and a space between the second support frame and the third plate being capable of accommodating another electronic device; a lower end of the first plate pivotally connects with the second plate by means of a first pivotal shaft and the third plate pivotally connects with an elongated groove disposed at the second plate by means of a second pivotal shaft such that the third plate is capable of extending to approach the second support frame.

2. The foldable host unit case with joint mechanisms as defined in claim 1, wherein the first connecting rods are shorter than the second connecting rods respectively.

3. The foldable host unit case with joint mechanisms as defined in claim 1, wherein the four ends of the cross connecting rod set joined to the first lower end, the second lower end, the third lower end and the fourth lower end constitute a part for joining either the first lateral plate or the second lateral plate.

4. The foldable host unit case with joint mechanisms as defined in claim 1 further comprises an upper cover and a lower cover to be detachably attached to the upper side and the bottom side of the main structure.

5. The foldable host unit case with joint mechanisms as defined in claim 4 further comprises a front panel and a rear wall to be attached to the front side and the rear side of the main structure.

6. The foldable host unit case with joint mechanisms as defined in claim 5, wherein the four ends of the cross connecting rod set being joined to the first lower end, the second lower end, the third lower end and the fourth lower end constitute a part for joining one of the upper cover, the lower cover, the rear wall and the front panel.

* * * * *